United States Patent
Wang et al.

(10) Patent No.: US 8,120,109 B2
(45) Date of Patent: Feb. 21, 2012

(54) LOW DOSE SUPER DEEP SOURCE/DRAIN IMPLANT

(75) Inventors: Zhongze Wang, Boise, ID (US); Inna V. Patrick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 431 days.

(21) Appl. No.: 10/896,711

(22) Filed: Jul. 22, 2004

(65) Prior Publication Data
US 2005/0003598 A1 Jan. 6, 2005

Related U.S. Application Data

(62) Division of application No. 10/230,809, filed on Aug. 29, 2002, now Pat. No. 6,767,778.

(51) Int. Cl.
*H01L 29/76* (2006.01)

(52) U.S. Cl. ........................... 257/344; 257/408

(58) Field of Classification Search .............. 257/344, 257/408, E29.278
See application file for complete search history.

(56) References Cited

U.S. PATENT DOCUMENTS

| | | | | |
|---|---|---|---|---|
| 5,324,974 A * | 6/1994 | Liao | ............................... | 257/344 |
| 5,350,698 A | 9/1994 | Huang et al. | | |
| 5,405,788 A | 4/1995 | Manning et al. | | |
| 5,440,165 A * | 8/1995 | Mitsunaga et al. | ........... | 257/408 |
| 5,565,700 A * | 10/1996 | Chou et al. | ................... | 257/408 |
| 5,595,919 A | 1/1997 | Pan | | |
| 5,793,090 A | 8/1998 | Gardner et al. | | |
| 5,831,306 A * | 11/1998 | Gardner et al. | ................ | 257/344 |
| 5,847,428 A * | 12/1998 | Fulford et al. | ................. | 257/344 |
| 5,998,849 A | 12/1999 | Ishimaru et al. | | |
| 6,117,737 A * | 9/2000 | Wang et al. | ..................... | 438/275 |
| RE36,938 E * | 10/2000 | Chan et al. | ..................... | 438/612 |
| 6,180,472 B1 | 1/2001 | Akamatsu et al. | | |
| 6,200,879 B1 | 3/2001 | Tyagi | | |
| 6,218,226 B1 * | 4/2001 | Lin et al. | ........................ | 438/200 |
| 6,297,528 B1 * | 10/2001 | Chen et al. | ...................... | 257/311 |
| 6,365,472 B1 | 4/2002 | Ishimaru et al. | | |
| 6,451,704 B1 * | 9/2002 | Pradeep et al. | ................ | 438/719 |
| 6,573,193 B2 * | 6/2003 | Yu et al. | ......................... | 438/770 |
| 2004/0110346 A1 * | 6/2004 | Tao | ................................ | 438/286 |

OTHER PUBLICATIONS

E. Augendre et al.; Arsenic and Phosphorus co-Implantation for Deep Submicron CMOS Gate and Source/Drain Engineering; 4 pages; IMEC vzw; Belgium.

Jae-Kwan Park et al.; The Effect of Impact Ionization on the Sub-threshold Leakage Current in N-Channel Double-Gate SOI Transistors; 4 pages; Department of Electrical Engineering; California.

* cited by examiner

*Primary Examiner* — Eugene Lee
(74) *Attorney, Agent, or Firm* — Wells St. John, P.S.

(57) ABSTRACT

A semiconductor device for reducing junction capacitance by an additional low dose super deep source/drain implant and a method for its fabrication are disclosed. In particular, the super deep implant is performed after spacer formation to significantly reduce junction capacitance in the channel region.

54 Claims, 5 Drawing Sheets

US 8,120,109 B2

LOW DOSE SUPER DEEP SOURCE/DRAIN IMPLANT

CROSS REFERENCE TO RELATED APPLICATIONS

This application is a division of U.S. patent application Ser. No. 10/230,809 filed Aug. 29, 2002.

BACKGROUND OF THE INVENTION

The invention relates to the fabrication of integrated circuit devices, and more particularly, to a semiconductor device having reduced junction capacitance by an additional low dose super deep source/drain implant, and to a method for fabricating such a device.

As the semiconductor industry progresses to even smaller sub-micron dimensions, continued advances in manufacturing techniques are required to provide submicron semiconductor devices with acceptable electrical characteristics. As CMOS gate lengths are reduced, the risk of a short-channel effect, called punch-through, rises. Punch-through is a circuit breakdown in which the drain voltage reaches a sufficiently large value that the depletion layer associated with the drain spreads across the substrate and reaches the source. This causes a destructive source/drain conduction path or leakage current.

Various approaches have been taken to avoid short-channel effects. One technique for avoiding punch-through is to raise the well or substrate dopant concentration, reducing the size of the depletion region so that punch-through does not occur when a voltage is applied. However, increasing the well concentration has drawbacks. The high substrate doping level causes a high source/drain junction capacitance, a low junction breakdown voltage, an increase in transistor threshold voltage, and high body effects. Furthermore, a high well concentration reduces carrier mobility, leading to a lowering of drive current.

Anti-punchthrough (APT) implants have been developed as an alternative to raising the dopant concentration generally throughout the well or substrate. APT implants increase dopant concentrations only near the channel and source/drain region, not throughout the entire substrate. Examples of such APT implants are halo implants and pocket implants, which are illustrated by FIG. 1.

Over a semiconductor substrate 10, a polycide gate 11 is formed. Heavily doped source and drain (HDD) regions 24 and lightly doped source and drain (LDD) regions 30 have been implanted. On a respective side of the polycide gate 11, for convenience of illustration, there is either a halo implant 17 or a pocket implant 34. The halo implant 17 is a self-aligned implant in which the polycide gate 11 acts as a mask during implant. The halo implant 17 is performed with a dopant opposite to that of the implant in the LDD regions 30. As illustrated, the halo implant 17 is deeper both vertically and laterally than its respective LDD region 30.

The pocket implant 34 is also a self-aligned implant in which a small pocket of a heavy dopant concentration is formed adjacent the LDD regions 30 to block the potential leakage path while allowing the channel region 15 to maintain a lower dopant concentration. In particular, the pocket implant 34 raises dopant concentrations only where the increased doping is needed, rather than raising the well concentration uniformly throughout the substrate 10, as is the case with the halo implant 17.

However, providing a pocket implant under the LDD regions by conventionally known methods, such as disclosed by U.S. Pat. No. 5,595,919, is both complicated and expensive by requiring additional processing steps, which adds production cost to the integrated circuit device. Accordingly, the present inventors have recognized a need for further improvements in semiconductor processing to provide reduce junction capacitance in the fabrication of integrated circuits by less complicated methods, requiring fewer processing steps, thereby reducing production costs.

SUMMARY OF THE INVENTION

The present invention is a sub-micron semiconductor device addressing junction capacitance through the use of a super deep but low dose source/drain implant performed in addition to source/drain implantation as well as a method of fabricating such a device. The super deep source/drain implant (i.e., implantation greater than about 0.25 Φm) is performed after spacer formation to significantly reduce junction capacitance in the channel region. Although junction depth increases, there is a de minimis effect on the channel such that device performance is not sacrificed by the low dose super deep implant. The implantation process of the present invention may be applied to both n-channel and p-channel transistors.

In accordance with one embodiment, a method for fabricating semiconductor devices comprises providing a substrate, forming active areas on the substrate, isolating the active areas with a field oxide, and forming polycide gates having spacers in the active areas. The method further comprises implanting a first dopant at low energy into the substrate. The first dopant has a dosage sufficient to form a heavily doped source/drain region in the substrate adjacent the nitride spacers. The method further comprises implanting a second dopant comprising the same conductivity type as the first dopant but at a lower dosage and with greater energy to form a deeper lightly doped source/drain region in the substrate below the heavily doped source/drain region. Continuing processing is performed to form an active semiconductor device in the active areas.

In another embodiment of the invention, a method of fabricating an integrated circuit device having reduced junction capacitance comprises providing a layer of a field oxide over the surface of a semiconductor substrate, forming a gate electrode overlying the field oxide layer, and forming a silicon oxide layer having sidewalls on the surface and sidewalls of the gate electrode. The method further comprises forming silicon nitride spacers on the sidewalls of the silicon oxide sidewall layer, and implanting first ions having a first dosage and a first energy into the substrate to form a heavily doped source/drain region in the substrate adjacent the silicon nitride spacers. The method further comprises implanting second ions having the same conductivity type as the first ions, but at a second dosage lower than the first dosage and with a second energy greater than the first energy, to form a deeper lightly doped source/drain region in the substrate below the heavily doped source/drain region. The method further comprises annealing the substrate, and removing the silicon nitride spacers. The method further comprises implanting third ions with a third dosage at a third energy into the substrate to form lightly doped regions in the semiconductor substrate. Continuing processing is performed to fabricate the integrated circuit device.

In still other embodiment of the invention, a method of fabricating an integrated circuit device having reduced junction capacitance comprises providing a layer of a gate oxide over the surface of a semiconductor substrate. A gate electrode is formed overlying the gate oxide layer. The method further comprises forming a silicon oxide layer having sidewalls on the surface and sidewalls of the gate electrode, and implanting first ions with a first dosage at a first energy into the substrate to form lightly doped regions in the semiconductor substrate adjacent the gate electrode. The method further comprises forming silicon nitride spacers on the sidewalls of the silicon oxide sidewall layer, and implanting second ions having a second dosage and at a second energy into the substrate to form a heavily doped source/drain region in the substrate adjacent the silicon nitride spacers. Third ions are implanted having the same conductivity type as the first ions but at a third dosage lower than the second dosage and with a third energy greater than the third energy to form a deeper lightly doped source/drain region in the substrate below the heavily doped source/drain region. The method further comprises annealing the substrate, and continuing processing to fabricate the integrated circuit device.

In yet another embodiment, an integrated circuit device having reduced junction capacitance comprises a gate electrode overlying a gate silicon oxide layer on a surface of a semiconductor substrate, a silicon oxide layer lying on a surface and sidewalls of the gate electrode, and silicon nitride spacers on the sidewalls of the silicon oxide sidewall layer. Lightly doped source and drain regions lie within the semiconductor substrate not covered by the gate electrode and the silicon oxide sidewall layer. Heavily doped source and drain regions lie within the semiconductor substrate not covered by the gate electrode, the silicon oxide sidewall layer, and the nitride spacers adjacent to the lightly doped source and drain regions. Deeper lightly doped source and drain regions underlie the heavily doped source and drain regions within the semiconductor substrate.

In still yet another embodiment, an integrated circuit device having reduced junction capacitance comprises a gate electrode overlying a gate silicon oxide layer on a surface of a semiconductor substrate, a silicon oxide layer lying on a surface and sidewalls of the gate electrode. Lightly doped source and drain regions lie within the semiconductor substrate not covered by the gate electrode and the silicon oxide sidewall layer. Heavily doped source and drain regions lie within the semiconductor substrate adjacent to the lightly doped source and drain regions. Deeper lightly doped source and drain regions underlie the heavily doped source and drain regions within the semiconductor substrate.

These and other features and advantages of the invention will be more fully understood from the following description of some embodiments of the invention taken together with the accompanying drawings. It is noted that the scope of the claims is defined by the recitations therein and not by the specific discussion of features and advantages set forth in the present description.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION OF THE PREFERRED EMBODIMENTS

A sub-micron semiconductor device having reduced junction capacitance and method of fabricating such a device is described. The device includes a super deep, low dose, source and drain implant performed in addition to source/drain implantation is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, known materials or methods are not described in detail to avoid unnecessarily obscuring the present invention.

Further, it should be noted that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing portions of an integrated circuit during fabrication are not drawn to scale, but instead are drawn to illustrate features of the invention.

It should be noted that although the following description describes embodiments showing only the N-channel metal oxide field effect transistor (MOSFET) portion of a CMOS integrated circuit device, other arrangements of p-type wells, n-type wells, and combinations of the two with many different doping levels may be used and still preserve the essence of the present invention. Moreover, it is well understood by those skilled in the art that the P-channel portion of a CMOS integrated circuit device can be formed by simply substituting opposite polarities to those given for the N-channel embodiments.

Figure 1:
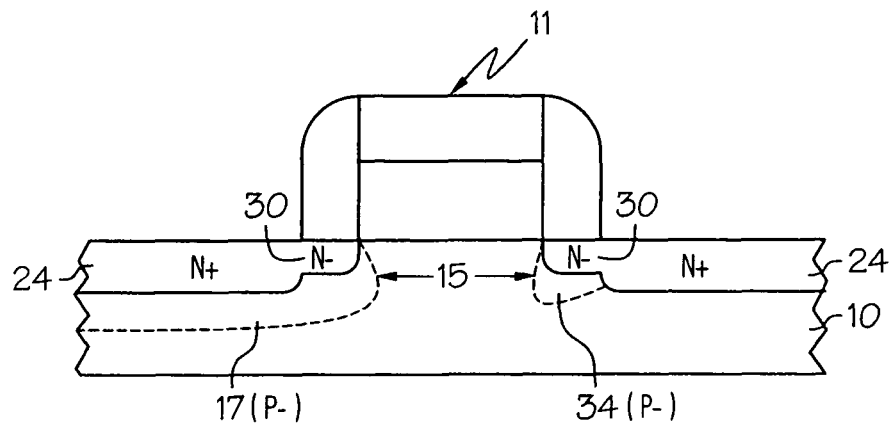
FIG. 1 schematically illustrates in cross-sectional representation, anti-punchthrough (APT) implants of the prior art.
Figure 2:
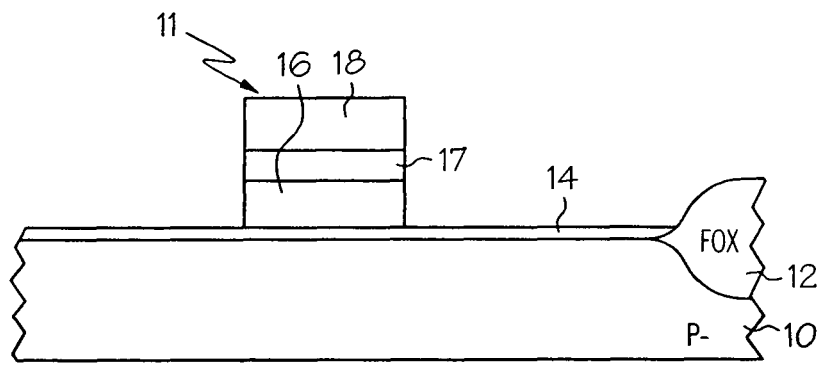
FIGS. 2 through 9 schematically illustrate in cross-sectional representation a process for reducing junction capacitance of a semiconductor device having DSD regions in accordance with the present invention.

Referring now more particularly to FIG. 2, there is shown an illustration of the N-channel portion of a partially completed polycide gate structure 11 of a MOSFET.

The process begins with shallow trench isolation of a substrate 10, which can be any semiconductor material, including, for example, gallium arsenide (GaAs), silicon (Si), and germanium (Ge) to form isolated active areas of the substrate 10. If desired, field oxide regions 12 may also be provided to the active areas for the same purpose. The surface of the substrate 10 is then thermally oxidized to form the gate oxide 14 to a desired thickness. The thickness of gate oxide 14 may be from about 15 to about 200 Angstroms.

The polysilicon layer 16 is deposited by low-pressure chemical vapor deposition (LPCVD) to a thickness of between about 300 to about 3000 Angstroms. A polycide layer 17 is deposited by PECVD to a thickness of about 100 to about 1000 Angstroms. A capping or nitride dielectric layer 18 is formed over the polycide layer 17 to a thickness of between about 300 to 600 Angstroms. A layer of photoresist (not shown) is applied over the cap oxide layer 18 and patterned to form a photoresist mask where gate electrodes and/or interconnecting lines are to be formed. The polysilicon layer 16, the polycide layer 17, and the cap oxide layer 18 are etched away in areas not covered by the mask to form gate structure 11.

Figure 3:
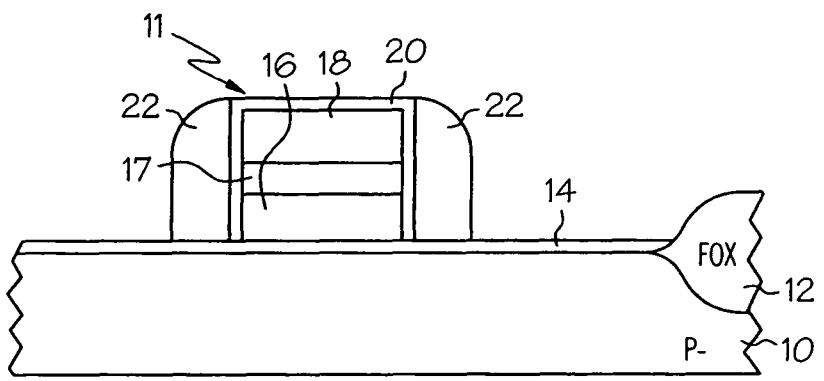

Referring now to FIG. 3, a thin oxide layer 20 is grown or deposited on the top and sidewalls of the gate structure 11 to a thickness of between about 15 to about 150 Angstroms. A dielectric layer is then deposited and partially etched away to leave spacers 22 on the sidewalls of the gate electrode, as shown in FIG. 3. The spacers 22 may have a base width from about 100 to about 1000 Angstrom, and be silicon nitride, or any other suitable spacer material. The source/drain structure of the semiconductor circuit may now be formed.

Figure 4:
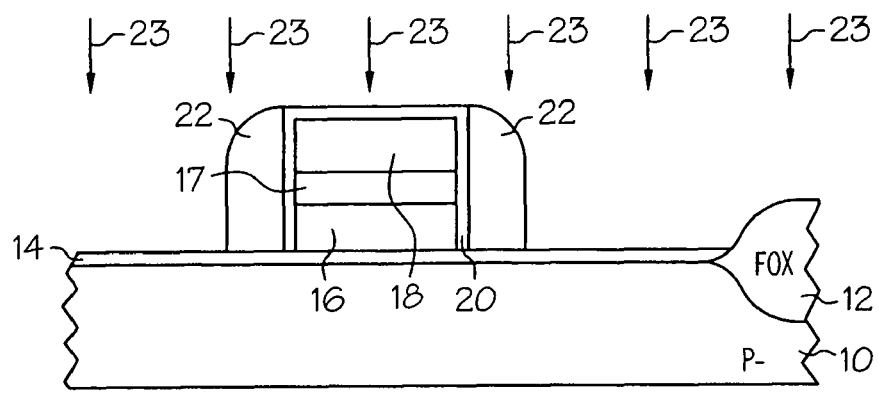

Referring now to FIG. 4, heavily doped source and drain (HDD) regions are formed by the ion implantation of N+ ions 23. Ions selected from phosphorus, arsenic, antimony ions and the like are implanted at energies within ranges that are conventional in the art to achieve a selected source and drain impurity ion amount. Typically, N+ ions are implanted at dosages of between about $1 E 14$ to about $1 E 16$ atoms/cm$^2$ and at energies of between about 1 to about 50 KeV. For P+ regions, boron or $BF_2$ ions are used. Heavily doped regions 24 are shown in FIG. 5.

Figure 6A:
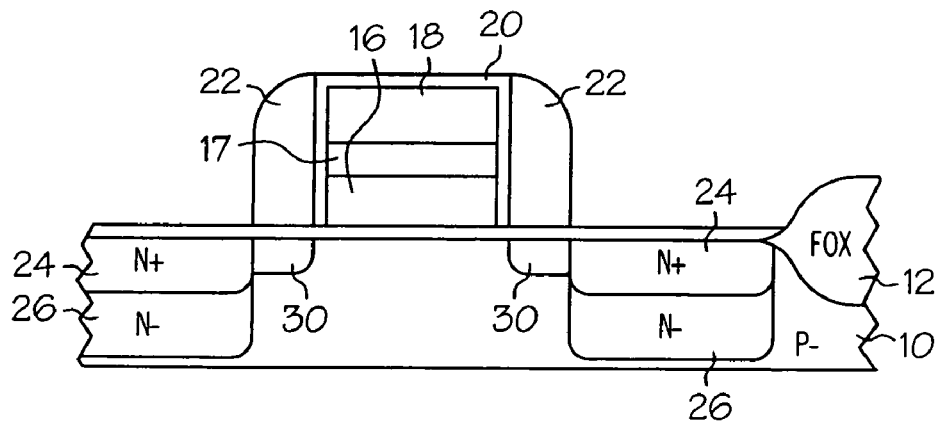
Figure 5:
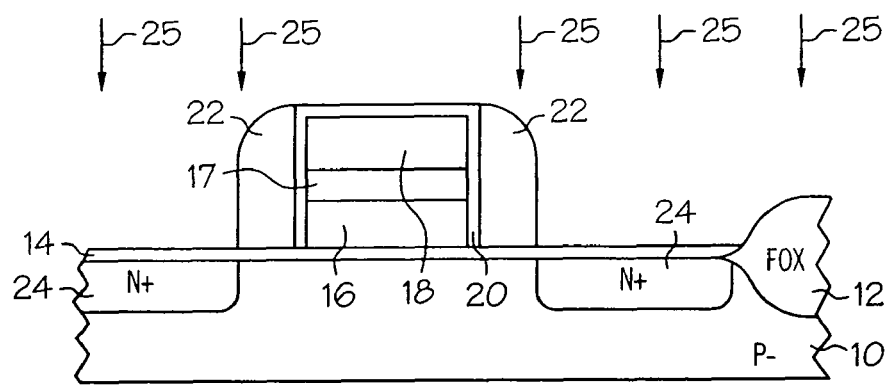
Figure 6:
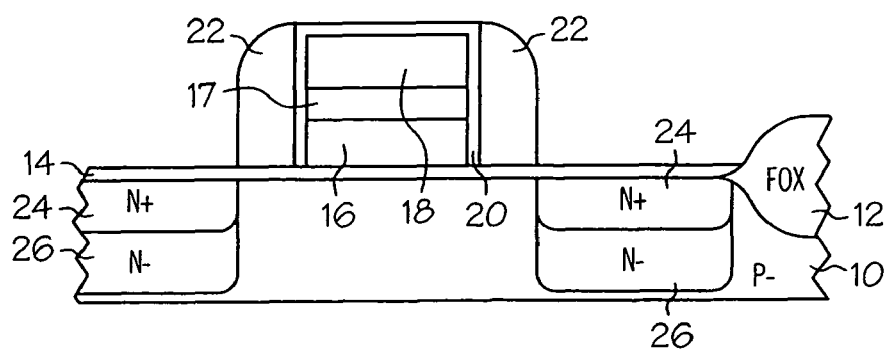

Referring now to FIGS. 5 and 6, after the HDD region implant deeper source/drain region implants are formed by implanting ions 25. Ions 25 are the same type (i.e., N+) as ions 23, but are implanted at dosages of between about $1 E 12$ to about $1 E 14$ atoms/cm$^2$, and at energies of between about 30 to about 100 KeV for phosphorus, and of between about 60-250 KeV for arsenic. For P+ regions, the ions are the same type ions used in the HDD P+ region implant, and are at the similar dosages. For boron implant, the energies are at between about 15 to about 50 KeV, and for BF2 energies of between 75 KeV to 250 KeV. Deeper source drain (DSD) regions 26 formed by the subsequent deep source/drain region implant are shown in FIG. 6, which significantly decrease junction capacitance in the channel region. As illustrated, the DSD regions 26 are implanted deeper into substrate 10 than the HDD regions 24. The deepest surface of the DSD N− region 26 has a depth in the range of from about 0.1 Φm to about 0.5 Φm. The deepest surface of the DSD P− region has a depth in the range of also from about 0.1 Φm to about 0.5 Φm.

The substrate 10 is then annealed, for example, at a temperature of between about 850° C. to about 1100° C. for between about 0.2 to about 30 minutes, to drive out the impurities. Those skilled in the art will appreciate that performing the deep source/drain region implant immediately after the HDD region implant, permits both processes to share the same photo mask. Accordingly, no additional photo steps are needed. However, alternatively, the subsequent DSD region implant may be carried out after annealing, wherein additional photo steps would be needed.

Further, it is to be appreciated that the above process steps may be performed before or after the photo steps for forming P-channel transistors in a CMOS device. In such an embodiment, after spacer formation and the subsequent steps (resist coating, exposure, and development) to cover the P+ source/drain regions with a resist, the above-described N+ source/drain implantation and deeper N+ source/drain implantation may be carried out.

Figure 6B:
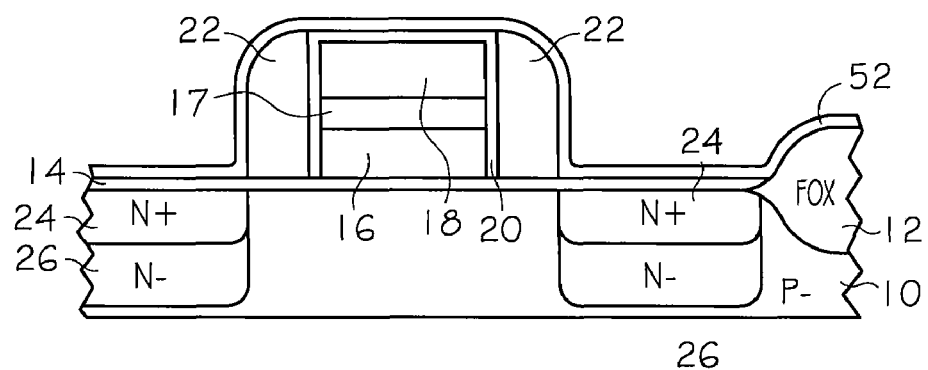

Moreover, in any of the above described process steps, the DSD region implant may be implemented before the HDD region implantation, as long as it is after spacer 22 formation, and so long as some measures are taken to reduce channeling of the deep source/drain implant. For example, reducing channeling of the deep source/drain implant may be achieved either by a slight implantation tilt angle from about 1° to about 7° from vertical, or by a deposition of a thin layer of from about 50 to about 500 Angstroms of amorphous material 52 (e.g. oxide, nitride) prior to implantation (see FIG. 6B).

Figure 7:
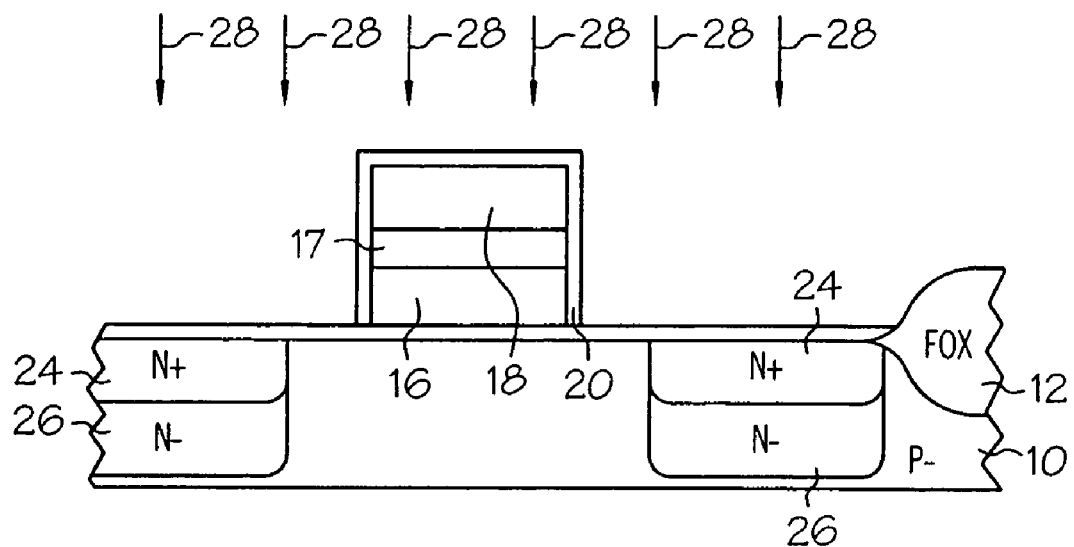
Figure 8:
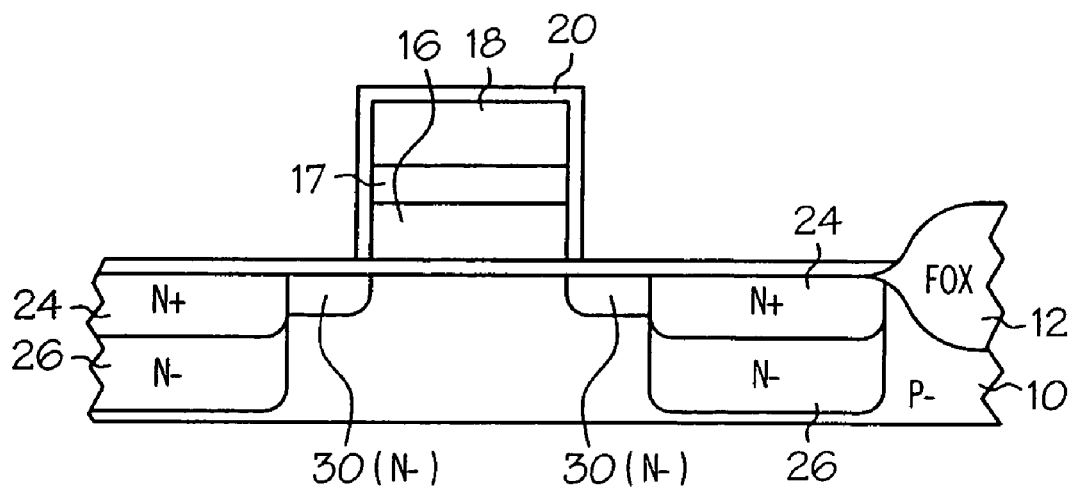

Referring to FIG. 7, next lightly doped source and drain (LDD) regions adjacent the channel region are formed in the substrate 10. In one embodiment, after removal of spacers 22, the lightly doped drain (LDD) N− regions are formed by implanting ions 28. Typically, arsenic or phosphorus ions are implanted with dosages of between about $1 E 13$ to $5 E 14$ atoms/cm$^2$ at energies of between about 1 to 30 KeV. The ion implantation forms lightly doped N− regions 30, as illustrated in FIG. 8. This followed by halo implant.

Figure 2A:
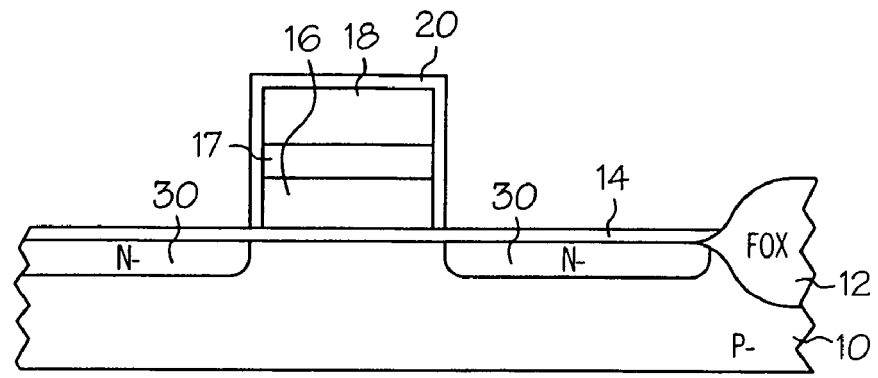

In another embodiment, the LDD regions may be formed before the formation of spacers 22. After forming the silicon oxide layer 20 on the structure illustrated by FIG. 2, the LDD N− regions 30 may be formed by implanting ions 28. Typically, arsenic or phosphorus ions are implanted with dosages of between about $1 E 13$ to $5 E 14$ atoms/cm$^2$ at energies of between about 1 to 30 KeV. The ion implantation forms LDD N− regions 30, as illustrated in FIG. 2A. This is followed by halo implant.

Figure 3A:
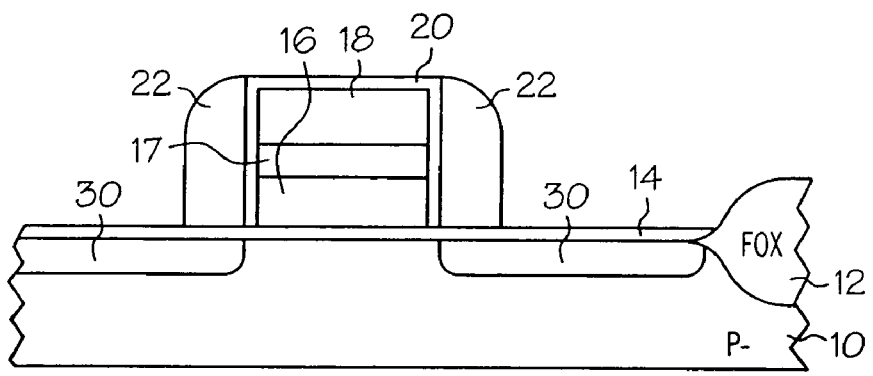

Spacers 22 are then formed over the LDD region 30 to form the structure illustrated by FIG. 3A. The HDD region implantation and DSD region 26 may be formed according to the previous process steps described with references to FIGS. 4-5, resulting in the structure illustrated by FIG. 6A.

Figure 9:
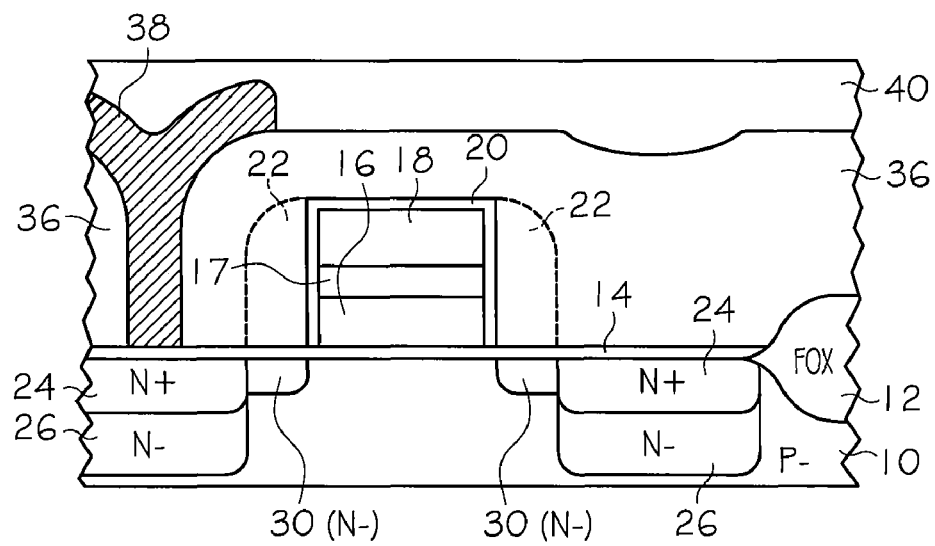

In any of the above-described embodiments, the integrated circuit device may then be completed as is conventional in the art. For example, as illustrated in FIG. 9, insulating layer 36 is deposited over the surface of the substrate, with or without spacers 22. Contact openings are made through the insulating layer to the underlying semiconductor devices, such as to a source/drain region 24. A metal layer 38 is deposited and patterned to form electrical connections between the elements of the integrated circuit. A passivation layer 40 completes the fabrication of the integrated circuit.

A sub-micron semiconductor device addressing short channel effects and junction capacitance by a super deep, low dose, source and drain implant performed in addition to source/drain implantation and method for its fabrication have been disclosed. It is to be appreciated that the method of the present invention permits improved device performance by allowing for continued device scaling. In particular, junction capacitance is inversely proportional to the depletion width of the junction. Additionally, the depletion width of the junction increases as the net doping concentration on either side of the junction decreases. The present invention addressing junction capacitance by implanting dopants deep into the source/drain regions of the substrate, which reduces the net doping concentration of the junction by compensating the substrate dopant.

While the invention has been particularly shown and described with reference to the preferred embodiments thereof, it will be understood by those skilled in the art that various changes in form and details may be made without departing from the spirit and scope of the invention.

What is claimed is:

1. A semiconductor device having reduced junction capacitance, comprising:
    a substrate;
    a gate oxide layer provided over said substrate;
    a polycide gate provided on said gate oxide layer and having an oxide layer formed on a top surface and sidewalls of said polycide gate and nitride spacers formed on said sidewalls, said oxide layer positioned between said polycide gate and said nitride spacers, the polycide gate comprising a polysilicon layer, a polycide layer, and a dielectric layer, the dielectric layer forming the top surface of the polycide gate on which the oxide layer is formed;
    a first dopant implanted into said substrate, said first dopant having a first dosage sufficient to form a heavily doped source/drain region in said substrate adjacent said nitride spacers;
    a second dopant comprising the same conductivity type as said first dopant but at a lower dosage than said first dosage and implanted deeper into said substrate to form a lightly doped source/drain region in said substrate below said heavily doped source/drain region; and an amorphous layer of about 50 to 500 Angstroms provided on said gate oxide layer directly above said lightly doped source/drain region.

2. A semiconductor device as recited in claim 1, wherein said first dopant and said second dopant are p-conductivity type dopants.

3. A semiconductor device as recited in claim 1, wherein said first dopant and said second dopant are n-conductivity type dopants.

4. A semiconductor device as recited in claim 1, wherein said first dopant and said second dopant are selected from the group consisting of boron, $BF_2$, and combinations thereof.

5. A semiconductor device as recited in claim 1, wherein said first dopant and said second dopant are selected from the group consisting of phosphorus, arsenic, antimony, and combinations thereof.

6. A semiconductor device as recited in claim 1 wherein said lower dosage of said second dopant is between about 1 E 12 to about 1 E 14 atoms/cm$^2$, and said first dosage of said first dopant is between about 1 E 13 to 1 E 16 atoms/cm$^2$.

7. A semiconductor device as recited in claim 1 wherein a deepest surface of said lightly doped source/drain region has a depth in the range from about 0.1 μm to about 0.5 μm.

8. A semiconductor device as recited in claim 1 wherein said nitride spacers have a base width in the range from about 100 to about 1000 Angstroms.

9. A semiconductor device as recited in claim 1 wherein said oxide layer has a thickness in the range from about 15 to about 150 Angstroms.

10. A semiconductor device having reduced junction capacitance comprising:
   a gate oxide layer provided over a semiconductor substrate having lightly doped regions;
   a polycide gate electrode provided on said gate oxide layer, said polycide gate electrode having a top surface and sidewalls;
   an oxide layer provided on said top surface and said sidewalls of said polycide gate electrode;
   nitride spacers provided proximate said sidewalls of said polycide gate electrode on said oxide layer;
   first ions having a first dosage implanted into the substrate to form a heavily doped source/drain region in said substrate adjacent said spacers;
   second ions having the same conductivity type as said first ions but at a second dosage lower than said first dosage implanted into said substrate to form a deeper lightly doped source/drain region in the substrate below said heavily doped source/drain region, wherein the heavily doped source/drain region and the deeper lightly doped source/drain region have the same width, the width being measured along a horizontal axis positioned parallel to a largest dimension of the semiconductor substrate; and
   an amorphous layer of about 50 to 500 Angstroms provided on said gate oxide layer directly above said deeper lightly doped source/drain region.

11. A semiconductor device as recited in claim 10 wherein said second dosage is between about 1 E 12 to about 1 E 14 atoms/cm$^2$, wherein said second ions are selected from the group consisting of phosphorus, arsenic, boron, $BF_2$, and combinations thereof.

12. A semiconductor device as recited in claim 10 wherein said first ions and said second ions are each N$^+$ ions selected from the group consisting of phosphorus, arsenic, antimony ions, and combinations thereof.

13. A semiconductor device as recited in claim 10 wherein said first ions and second ions are each P$^+$ ions selected from the group consisting of boron, $BF_2$ ions, and combinations thereof.

14. A semiconductor device as recited in claim 10 wherein said substrate is a semiconductive material comprises gallium arsenide, silicon, and germanium, and combinations thereof.

15. A semiconductor device as recited in claim 10 wherein a deepest surface of said deeper lightly doped source/drain region has a depth in the range from about 0.1 μm to about 0.5 μm.

16. A semiconductor device as recited in claim 10 wherein said spacers comprises nitride and said spacers have a base width in the range from about 100 to about 1000 Angstroms.

17. A semiconductor device as recited in claim 10 wherein said gate oxide layer has a thickness in the range from about 15 to about 200 Angstroms.

18. A semiconductor device as recited in claim 10 wherein said polycide gate electrode further comprises a polysilicon layer having a thickness in the range from about 300 to about 3000 Angstroms.

19. A semiconductor device as recited in claim 18 wherein said polycide gate electrode further comprises a polycide layer having a thickness in the range from about 100 to about 1000 Angstroms.

20. A semiconductor device as recited in claim 19 wherein said polycide gate electrode further comprises a dielectric having a thickness in the range from about 300 to about 600 Angstroms.

21. A semiconductor device as recited in claim 10 wherein said first dosage of said first dopant is between about 1 E 13 to 1 E 16 atoms/cm$^2$.

22. A semiconductor device having reduced junction capacitance comprising:
   a gate oxide layer provided over a semiconductor substrate;
   a polycide gate electrode provided on said gate oxide layer, said polycide gate electrode having a top surface and sidewalls;
   an oxide layer provided on said top surface and said sidewalls of said gate electrode;
   nitride spacers provided proximate said sidewalls of said gate electrode and on said oxide layer;
   lightly doped regions having first ions with a first dosage provided in said semiconductor substrate adjacent said gate electrode;
   heavily doped source/drain regions having second ions with a second dosage provided in said substrate adjacent said nitride spacers; and
   deeper lightly doped source/drain regions, having third ions which are the same chemical element as said first ions but at a third dosage lower than said first dosage, provided in said substrate below said heavily doped source/drain regions, wherein sidewalls of the heavily doped source/drain regions and sidewalls of the deeper lightly doped source/drain regions are aligned with sidewalls of the nitride spacers.

23. A semiconductor device as recited in claim 22 wherein said first, second, and third ions are N+ ions selected from the group consisting of phosphorus, arsenic, antimony ions, and combinations thereof.

24. A semiconductor device as recited in claim 22 wherein said first ions, second ions, and third ions are each P+ ions selected from the group consisting of boron, $BF_2$ ions, and combinations thereof.

25. A semiconductor device as recited in claim 22 wherein said third dosage is between about 1 E 12 to about 1 E 14 atoms/cm$^2$.

26. A semiconductor device as recited in claim 22 wherein said second dosage is between about 1 E 13 to 1 E 16 atoms/cm$^2$.

27. A semiconductor device as recited in claim 22 wherein said first dosage is between about 1 E 13 to 5 E 14 atoms/cm$^2$.

28. A semiconductor device as recited in claim 22 wherein said second ions and said third ions are each N$^+$ ions selected from the group consisting of phosphorus, arsenic, antimony ions, and combinations thereof.

29. A semiconductor device as recited in claim 22 wherein said second ions and said third ions are each P$^+$ ions selected from the group consisting of boron, BF$_2$ ions, and combinations thereof.

30. A semiconductor device as recited in claim 22 wherein a deepest surface of said deeper lightly doped source/drain region has a depth in the range from about 0.1 μm to about 0.5 μm.

31. A semiconductor device as recited in claim 22 further comprising wherein said nitride spacers have a base width in the range from about 100 to about 1000 Angstroms.

32. A semiconductor device as recited in claim 22 wherein said oxide layer has a thickness in the range from about 15 to about 150 Angstroms.

33. A semiconductor device as recited in claim 22 wherein said gate oxide layer has a thickness in the range from about 15 to about 200 Angstroms.

34. A semiconductor device as recited in claim 22 wherein said polycide gate electrode further comprises a polysilicon layer having a thickness in the range from about 300 to about 3000 Angstroms.

35. A semiconductor device as recited in claim 22 wherein said polycide gate electrode further comprises a polycide layer having a thickness in the range from about 100 to about 1000 Angstroms.

36. A semiconductor device having reduced junction capacitance comprising:
a substrate;
a gate oxide layer provided on said substrate;
a gate electrode provided on said gate oxide layer, said gate electrode having a top surface and sidewalls,
an oxide layer provided on said top surface and said sidewalls of said gate electrode and contacting said gate oxide layer;
nitride spacers provided proximate said sidewalls of said gate electrode on said oxide layer;
lightly doped regions having first ions with a first dosage provided in said semiconductor substrate adjacent said gate electrode;
heavily doped source/drain regions having second ions with a second dosage provided in said substrate adjacent said lightly doped regions; and
deeper lightly doped source/drain regions, having third ions which are the same chemical element as said first ions but at a third dosage lower than said first dosage, provided in said substrate below said heavily doped source/drain regions, wherein one of the heavily doped source/drain regions and one of the deeper lightly doped source/drain regions are horizontally spaced from the gate electrode by the same distance, the one of the deeper lightly doped source/drain regions being below the one of the heavily doped source/drain regions.

37. A semiconductor device as recited in claim 36 wherein said first, second, and third ions are N+ ions selected from the group consisting of phosphorus, arsenic, antimony ions, and combinations thereof.

38. A semiconductor device as recited in claim 36 wherein said first ions, second ions, and third ions are each P+ ions selected from the group consisting of boron, BF$_2$ ions, and combinations thereof.

39. A semiconductor device as recited in claim 36 wherein said third dosage is between about 1 E 12 to about 1 E 14 atoms/cm$^2$.

40. A semiconductor device as recited in claim 36 wherein said second dosage is between about 1 E 13 to 1 E 16 atoms/cm$^2$.

41. A semiconductor device as recited in claim 36 wherein said first dosage is between about 1 E 13 to 5 E 14 atoms/cm$^2$.

42. A semiconductor device as recited in claim 36 wherein said second ions and said third ions are each N$^+$ ions selected from the group consisting of phosphorus, arsenic, antimony ions, and combinations thereof.

43. A semiconductor device as recited in claim 36 wherein said second ions and said third ions are each P$^+$ ions selected from the group consisting of boron, BF$_2$ ions, and combinations thereof.

44. A semiconductor device as recited in claim 36 wherein a deepest surface of said deeper lightly doped source/drain region has a depth in the range from about 0.1 μm to about 0.5 μm.

45. A semiconductor device as recited in claim 36 wherein said gate electrode further comprises an oxide layer and wherein said oxide layer has a thickness in the range from about 15 to about 150 Angstroms.

46. A semiconductor device as recited in claim 36 wherein said gate oxide layer has a thickness in the range from about 15 to about 200 Angstroms.

47. A semiconductor device as recited in claim 36 wherein said gate electrode further comprises a polysilicon layer having a thickness in the range from about 300 to about 3000 Angstroms.

48. A semiconductor device as recited in claim 36 wherein said gate electrode further comprises a polycide layer having a thickness in the range from about 100 to about 1000 Angstroms.

49. A semiconductor device as recited in claim 36 wherein said gate electrode further comprises a dielectric having a thickness in the range from about 300 to about 600 Angstroms.

50. A semiconductor device as recited in claim 36, further comprising an insulating film provided over said substrate so as cover at least said gate electrode and said oxide layer, a conductive material extending through said insulating layer to said heavily-doped regions, and a passivation layer provided over said insulating film.

51. The semiconductor device of claim 1 wherein the first dopant and the second dopant both comprise the same chemical element.

52. The semiconductor device of claim 1 wherein both a sidewall of the heavily doped source/drain region and a sidewall of the lightly doped source/drain region are aligned with a sidewall of one of the nitride spacers.

53. The semiconductor device of claim 10 further comprising an insulating layer provided on said amorphous layer and wherein the amorphous layer is configured to reduce channeling of said second ions.

54. The semiconductor device of claim 1 wherein sidewalls of the heavily doped source/drain regions and sidewalls of the deeper lightly doped source/drain regions are aligned with sidewalls of the nitride spacers and the dielectric layer of the polycide gate comprises a nitride.

* * * * *

UNITED STATES PATENT AND TRADEMARK OFFICE
CERTIFICATE OF CORRECTION

| | | |
|---|---|---|
| PATENT NO. | : 8,120,109 B2 | Page 1 of 1 |
| APPLICATION NO. | : 10/896711 | |
| DATED | : February 21, 2012 | |
| INVENTOR(S) | : Zhongze Wang et al. | |

It is certified that error appears in the above-identified patent and that said Letters Patent is hereby corrected as shown below:

In column 8, line 58, in Claim 23, delete "N+" and insert -- $N^+$ --, therefor.

In column 8, line 62, in Claim 24, delete "P+" and insert -- $P^+$ --, therefor.

In column 9, line 65, in Claim 37, delete "N+" and insert -- $N^+$ --, therefor.

In column 10, line 2, in Claim 38, delete "P+" and insert -- $P^+$ --, therefor.

In column 10, line 46, in Claim 50, delete "as cover" and insert -- as to cover --, therefor.

Signed and Sealed this
Seventeenth Day of April, 2012

David J. Kappos
*Director of the United States Patent and Trademark Office*